United States Patent

Lau et al.

[11] Patent Number: 6,141,285
[45] Date of Patent: Oct. 31, 2000

[54] POWER DOWN SCHEME FOR REGULATED SENSE AMPLIFIER POWER IN DRAM

[75] Inventors: Hon-Shing Lau, Hsinchu; Jeng-Feng Lan, Ping Tung; Jr-Houng Lu, Keelung, all of Taiwan

[73] Assignee: Vanguard International Semiconductor Corporation, Hsinchu, Taiwan

[21] Appl. No.: 09/510,946

[22] Filed: Feb. 22, 2000

[51] Int. Cl.⁷ .................................................. G11C 7/00
[52] U.S. Cl. ...................... 365/227; 365/194; 365/205; 365/208
[58] Field of Search ..................................... 365/191, 194, 365/149, 226, 227, 205, 207, 208

[56] References Cited

U.S. PATENT DOCUMENTS

| | | | |
|---|---|---|---|
| 5,280,452 | 1/1994 | Dhong et al. | 365/205 |
| 5,526,319 | 6/1996 | Dennard et al. | 365/226 |
| 5,977,798 | 11/1999 | Zerbe | 326/98 |

*Primary Examiner*—Son Mai
*Attorney, Agent, or Firm*—Harness, Dickey & Pierce, P.L.C.

[57] ABSTRACT

A power down scheme for a regulated sense amplifier power in DRAM. The power-supply level voltage Vccsa of a sense amplifier is turned on only within a certain time duration, which has no relationship with the word line turn-on time. The power down scheme includes control logic gates and time delay circuits which can be triggered by two internal control signals from other control modules in order to generate a power-down control signal for the bit line sense amplifier.

10 Claims, 2 Drawing Sheets

POWER DOWN SCHEME FOR REGULATED SENSE AMPLIFIER POWER IN DRAM

FIELD OF THE INVENTION

The present invention relates to a dynamic random access memories (DRAMs) device and, more specifically, to regulated sense amplifiers with power-down scheme in DRAMs.

BACKGROUND OF THE INVENTION

Nowadays, dynamic random access memories (DRAMs) are the highest volume production semiconductor devices. Because of their high integration level and relatively low power consumption, DRAMs have become the mainstay in many computer applications although they have more complex circuitry required to read, write, and refresh the data. Additionally, the adoption of DRAMs has greatly increased the amount of data that can be stored per unit area in memory cells. The advantages of low cost and high integration have the industry moved toward intense development of DRAMS.

In DRAMs, the sense amplifiers are designed for the read/write operation of each location of memory cells. DRAM cells are connected to sense amplifiers, which sense the voltage of the capacitors in the DRAM cells and compare the sensing voltages with a reference voltage in the sense amplifier. In this process, the content of the memory can be determined. The data contained in a DRAM cell, however, may be undetermined after a read/write operation, therefore, a refresh operation should apply therein.

One of the major concerns in the architecture of DRAMs is power consumption. DRAMs will continue moving to lower voltages driven by technology. For example, one of the specifications of the design of modern DRAMs is "power down active", which sets a limit for the power dissipation of DRAM chips.

For transistor reliability concerns, an on-chip voltage down converter (regulator) is used to maintain the external voltage level while providing a lower voltage across the memory cells in order to reduce the hot electron effect. In modern memory design, it is not unusual to have more than two regulated powers for the periphery circuitry and the bit line sense amplifier. However, the regulators always consume a large amount of DC current regardless whether they are operating or not.

In general, there is no power down (cut off) control on the regulated sense amplifier or the existing power down schemes do not meet the requirements of modern memory design specifications. One example of those schemes is that the time duration is set to be fixed for providing over time for the sense amplifier. In such a case, the power consumption could be too much, and the current variation and higher temperature are still arduous problems which need to be solved. Therefore, a smart power down scheme to turn off the Vcc of the bit line sense amplifier (Vccsa), thus reducing DC power consumption to a large extent, has to be developed.

SUMMARY OF THE INVENTION

Since there is no existing power control circuit on the sense amplifier (or one that is not so satisfied) for reducing power consumption, a smart solution should be provided. The feature of the present invention is to apply the output signals of other modules to implement the power down scheme for the sense amplifier.

The present invention provides a power down scheme for sense amplifiers with two internal signals, ras__x and slpf2pwr__x. These two inherent signals are coupled with a control logic circuit, which consists of two delay circuits and a plurality of logic gates, in order to generate a control signal for power down.

Therefore, a general object of the present invention is to generate power down control signals of the sense amplifiers in DRAMs.

The above object of the present invention is achieved by designing control logic gates and time delay circuits which can be triggered by other control modules in order to generate the control signals of power on/off for the bit line sense amplifier. The present invention includes control logic gates and time delay circuits which can be triggered by two internal control signals, i.e., the control signal of RAS (ras__x) and the power control signal of a bit line sense amplifier (slpf2pwr__x) from other control modules in order to generate a power-down control signal for the bit line sense amplifier.

BRIEF DESCRIPTION OF THE DRAWINGS

The detailed description of the present invention will be described by way of a preferred embodiment with reference to the accompanying drawings in which.

DETAILED DESCRIPTION OF THE PREFERRED EMBODIMENT

Figure 2:
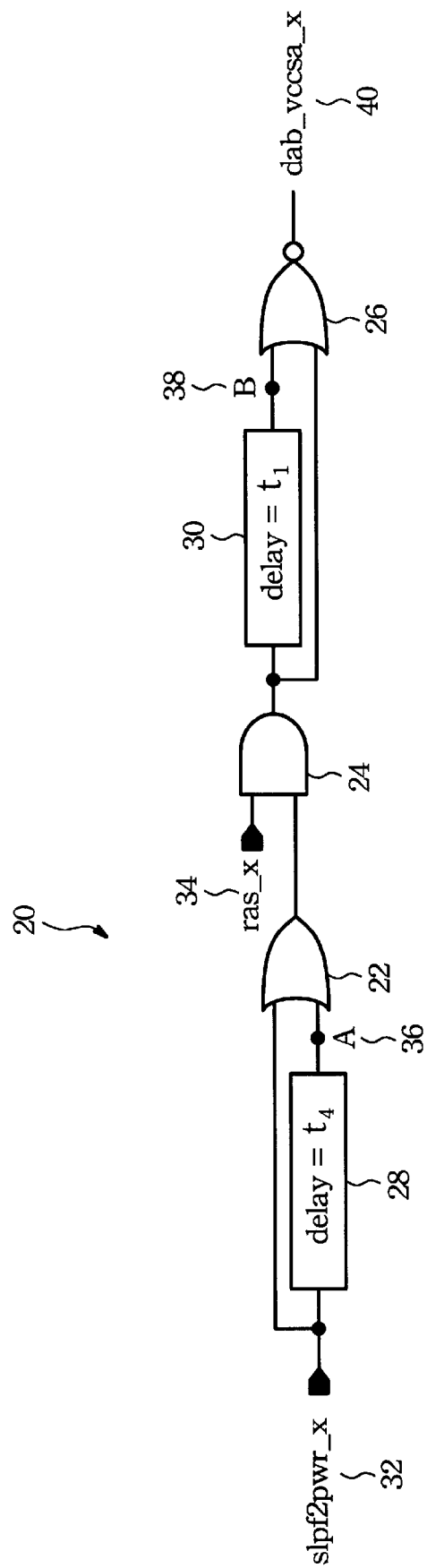
FIG. 2 shows the function diagram (control logic) of the present invention to generate a power down control signal.

Referring to FIG. 2, the function diagram of the present invention to generate a power down control signal is illustrated. The control logic circuit 20 consists of an OR gate 22, an AND gate 24, and a NOR gate 26. Additionally, there are two time delay circuits 28 and 30. The control signal of RAS, ras__x 34, is a control signal used to control the turn-on time of word lines. To read or to write first the row or word addresses are strobed in with a downward transition of the RAS clock to select one word-line. When the word-line is turned on, the power control signal of the bit line sense amplifier, slpf2pwr__x 32, will to be activated to supply power to the cross-coupled inverters (not shown) for latching data.

Figure 1:
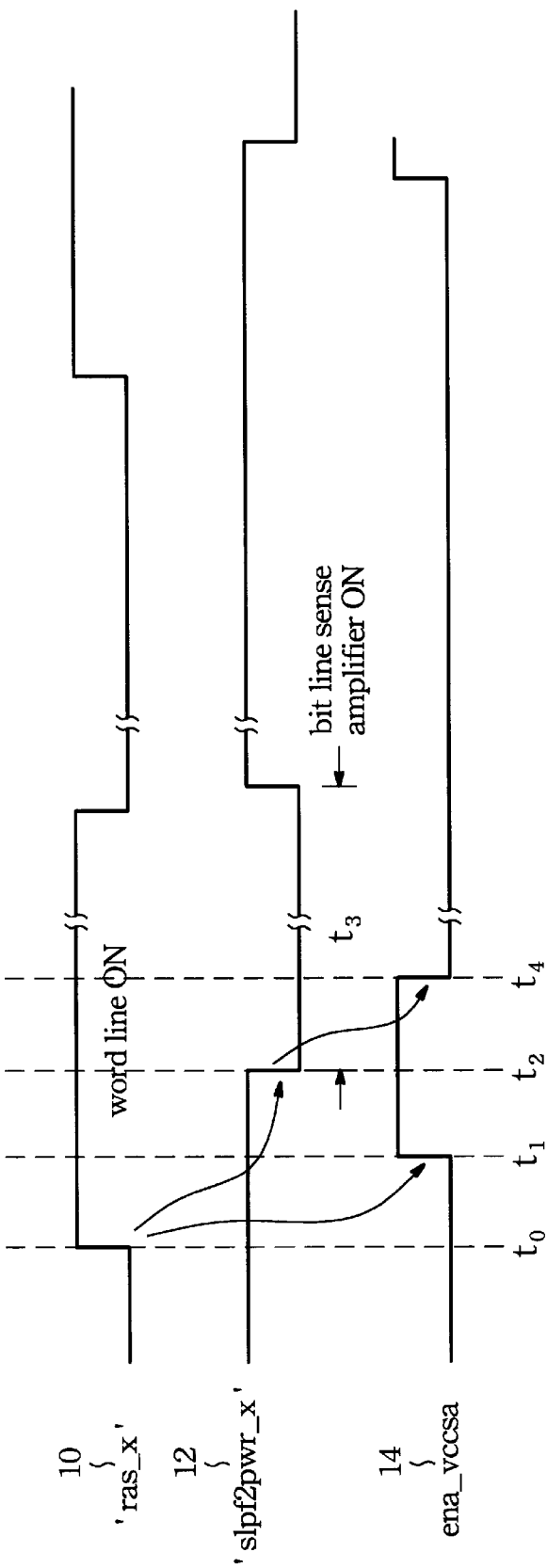
FIG. 1 shows the timing diagram of the power down scheme for the regulated power supply of a bit line sense amplifier.

Referring to FIG. 1, it shows the timing diagram of the power down scheme for the regulated power supply of a bit line sense amplifier is illustrated. First, consider the initial conditions of the logic levels of the individual inputs. The initial conditions of ras__x 10 (the control signal of RAS), slpf2pwr__x 12 (the power control signal of the bit line sense amplifier), ena__vccsa 14 (internal operating supply voltage of the sense amplifier), and node B 38 (as shown in FIG. 2) are logic 0, 1, 0, and 0, respectively.

Referring to FIG. 2, when the ras__x signal 34 goes up (logic 0 to 1), the dab__vccsa__x signal 40 (the power down control signal of Vccsa) remains at the initial level (logic 1). After a $t_1$ time delay, the dab__vccsa__x signal 40 changes to logic 0 since the logic at node B 38 is 1 due to the fact that the ras__x 34 goes through the time delay circuit 30, thus the output of the NOR gate 26 is logic 0. Therefore, the logic of dab__vccsa__x 40 goes down (logic 1 to 0). The time delay $t_1$, which is the time delay of the ras__x signal 10 to the ena__vccsa signal 14, is shown in FIG. 1. Note that the time delay circuits 28 and 30 can be implemented by designing a series connection of inverters to the extent desired.

Referring to FIG. 1, when the leading edge of the ras_x signal 10 occurs, the slpf2pwr_x signal 12 starts a process of time delay $t_2$. At the end of time $t_2$, the slpf2pwr_x signal 12 goes down to logic 0, and the ras_x signal 10, the node A 36 (as shown in FIG. 2), and the dab_vccsa_x signal 40 (as shown in FIG. 2) are logic 1, 0, and 1, respectively. Note that the turn-on time (time duration) of the bit line sense amplifier is denoted as $t_3$. The logic of the node A 36 will not change until the end of the time delay $t_4$, as shown in FIG. 1. Thus, the time delay $t_4$ can be seen as "self-time delay" generated by the internal signals. Now, referring to FIG. 2, the logic level at node A 36 is 0, and the logic of the dab_vccsa_x signal 40 will go up to logic 1 through the OR gate 22, the AND gate 24, and the NOR gate 26. So far as the "power-down active" mode is concerned, the bit line sense amplifier will be turned on in duration sufficient to latch data in memory cells.

Therefore, the dab_vccsa_x signal 40, which is the regulated power supply of the bit line sense amplifier, can be generated by the control logic circuit 20 (FIG. 2) described above. A power down scheme using the control signal generated by the control logic circuit of the present invention has the advantage of reducing the power consumption of Vccsa. The key point of a power down scheme described above is to turn on the power-supply level voltage Vccsa of a sense amplifier only within certain time duration, which has no relationship with the word line turn-on time.

For most of the modern memory designs, the specification of $t_{RAS}$, which is the word line turn-on time, might be up to 120,000 ns. By applying the power down scheme of the present invention, the DC power consumption of the Vccsa regulator can be reduced to 16.9% in comparison with the ras_x-control power down scheme.

As is understood by a person skilled in the art, the foregoing preferred embodiments of the present invention illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method of generating a power down signal for regulated sense amplifiers, the method comprising:

generating a power control signal of a bit line sense amplifier by a first control circuit;

supplying said power control signal of said bit line sense amplifier to an OR gate;

supplying said power control signal of said bit line sense amplifier to a first time delay circuit, and a first output signal of said first time delay circuit is supplied to said OR gate;

supplying a second output signal of said OR gate to an AND gate;

supplying a row address strobe (RAS) signal from a second control circuit to said AND gate;

supplying a third output signal of said AND gate to a NOR gate; and supplying said third output signal of said AND gate to a second time delay circuit, and a fourth output signal of said second time delay circuit is supplied to said NOR gate, and a fifth output signal of said NOR gate being served to be said power down signal for said regulated sense amplifiers.

2. The method according to claim 1, wherein an initial condition of said first control signal is logic 1.

3. The method according to claim 1, wherein an initial condition of said RAS signal is logic 0.

4. The method according to claim 1, wherein said first time delay circuit comprises a plurality of inverters.

5. The method according to claim 1, wherein said second time delay circuit comprises a plurality of inverters.

6. A control logic circuit for generating a power down control signal for regulated sense amplifiers in dynamic random access memories (DRAMs), comprising:

a first time delay circuit for delaying a first input signal;

an OR gate using said first input signal and an first output signal of said first time delay circuit as inputs, and having a second output signal;

an AND gate using a second input signal and said second output signal of said OR gate as inputs, and having a third output signal;

a second time delay circuit for delaying said third output signal of said AND gate; and a NOR gate using said third output signal of said AND gate and a fourth output signal of said second time delay circuit as inputs, and a fifth output signal of said NOR gate being served to be said power down signal for said regulated sense amplifiers.

7. The control logic circuit according to claim 6, wherein said first input signal is a power control signal of a bit line sense amplifier.

8. The control logic circuit according to claim 6, wherein said second input signal is a row address strobe (RAS) signal.

9. The control logic circuit according to claim 6, wherein said first time delay circuit comprises a plurality of inverters.

10. The control logic circuit according to claim 6, wherein said second time delay circuit comprises a plurality of inverters.

* * * * *